US012221692B2

(12) United States Patent
Ridgeway et al.

(10) Patent No.: US 12,221,692 B2
(45) Date of Patent: Feb. 11, 2025

(54) COMPOSITIONS AND METHODS USING SAME FOR DEPOSITION OF SILICON-CONTAINING FILM

(71) Applicant: Versum Materials US, LLC, Tempe, AZ (US)

(72) Inventors: Robert G. Ridgeway, Tempe, AZ (US); Raymond N. Vrtis, Tempe, AZ (US); Madhukar B. Rao, Tempe, AZ (US)

(73) Assignee: Versum Materials US, LLC, Tempe, AZ (US)

( * ) Notice: Subject to any disclaimer, the term of this patent is extended or adjusted under 35 U.S.C. 154(b) by 0 days.

(21) Appl. No.: 16/433,585

(22) Filed: Jun. 6, 2019

(65) Prior Publication Data

US 2019/0376178 A1 Dec. 12, 2019

Related U.S. Application Data

(63) Continuation of application No. 16/079,672, filed as application No. PCT/US2017/018873 on Feb. 22, 2017.

(60) Provisional application No. 62/683,142, filed on Jun. 11, 2018, provisional application No. 62/300,312, filed on Feb. 26, 2016.

(51) Int. Cl.
| | |
|---|---|
| *C23C 16/32* | (2006.01) |
| *C23C 16/36* | (2006.01) |
| *C23C 16/455* | (2006.01) |
| *C23C 16/513* | (2006.01) |

(52) U.S. Cl.
CPC ............ *C23C 16/325* (2013.01); *C23C 16/36* (2013.01); *C23C 16/513* (2013.01); *C23C 16/45553* (2013.01)

(58) Field of Classification Search
CPC ..... C23C 16/325; C23C 16/513; C23C 16/36; C23C 16/45553; C23C 16/50; C23C 16/30; C23C 16/045
See application file for complete search history.

(56) References Cited

U.S. PATENT DOCUMENTS

| | | | |
|---|---|---|---|
| 2008/0025907 A1 | 1/2008 | Tennison et al. | |
| 2009/0104755 A1* | 4/2009 | Mallick | C23C 16/56 438/477 |
| 2010/0291321 A1* | 11/2010 | Mallikarjunan | H01L 21/3148 427/579 |
| 2013/0217240 A1* | 8/2013 | Mallick | H01L 21/02211 438/778 |

(Continued)

FOREIGN PATENT DOCUMENTS

WO 2017/147150 A1 8/2017

*Primary Examiner* — Michael G Miller
(74) *Attorney, Agent, or Firm* — Daniel Roth

(57) ABSTRACT

Described herein are compositions and methods using same for forming a silicon-containing film such as without limitation a silicon carbide, silicon nitride, silicon oxide, silicon oxynitride, a carbon-doped silicon nitride, a carbon-doped silicon oxide, or a carbon doped silicon oxynitride film on at least a surface of a substrate having a surface feature. In one aspect, the silicon-containing films are deposited using a compound comprising a carbon-carbon double or carbon-carbon triple bond. The plasma source employed comprises both a remote plasma source and an in-situ plasma source operating in combination.

12 Claims, 4 Drawing Sheets

(56) References Cited

U.S. PATENT DOCUMENTS

2015/0196933 A1* 7/2015 Manna .................... C23C 16/56
    438/477
2018/0025907 A1   1/2018 Kalutarage et al.

* cited by examiner

COMPOSITIONS AND METHODS USING SAME FOR DEPOSITION OF SILICON-CONTAINING FILM

This application is a continuation-in part of U.S. application Ser. No. 16/079,672 filed on Aug. 24, 2018, which is a 371 of PCT/US2017/018873 filed on Feb. 22, 2017, which claims benefit of 62/300,312 filed on Feb. 26, 2016. This application also claims priority to U.S. Provisional Application 62/683,142 filed Jun. 11, 2018.

FIELD OF THE INVENTION

Described herein is a process for the fabrication of an electronic device. More specifically, described herein are compositions for forming a silicon-containing film in a deposition process, such as, without limitation, a flowable chemical vapor deposition. Exemplary silicon-containing films that can be deposited using the compositions and methods described herein include, without limitation, silicon oxide, silicon nitride, silicon carbide, silicon oxynitride or carbon-doped silicon oxide or carbon-doped silicon nitride films.

BACKGROUND OF THE INVENTION

In microelectronics device fabrication there is a need to fill narrow trenches having aspect ratios (AR) greater than 10:1 with no voiding for many applications. One application is for shallow trench isolation (STI). For this application, the film needs to be of high quality throughout the trench (having, for example, a wet etch rate ratio less than two) with very low leakage. As the dimensions of the structures decrease and the aspect ratios increase post curing methods of the as deposited flowable films become difficult. Resulting in films with varying composition throughout the filled trench.

Conventional plasma-enhanced chemical vapor deposition (PECVD) of dielectric films form a "mushroom shape" film on top of the narrow trenches. This is due to the inability of the plasma to penetrate into the deep trenches. The results in pinching-off the narrow trench from the top; forming a void at the bottom of the trench.

Additionally, silicon-containing films, such as SiCO, SiCON, SiCN, are widely used in the manufacture of semiconductor devices. For example, these carbon-containing gap-fill films can be used for patterning applications. Due to the presence of high carbon levels, these films typically show high etch selectivity compared to oxide and nitride films. The etch selectivity can be important for gap-fill films to be used in patterning applications. Therefore, there is a need for precursors and methods for depositing silicon-containing films.

US2008/0025907 discloses a process of forming a silicon-containing film on a substrate by what is known as flowable CVD or FCVD. The FCVD process is useful for many applications including depositing a gap-fill film in high aspect ratio structures with small dimensions. According to the disclosed process a precursor is exposed to reactive radicals to initiate a radical induced polymerization in a deposition chamber. The reactive radicals are produced using plasma energy. The plasma can be generated or ignited within the processing chamber (e.g. a direct or in-situ plasma) or can be generated outside of the processing chamber and flowed into the processing chamber (e.g. a remote plasma).

BRIEF SUMMARY OF THE INVENTION

The compositions or formulations described herein and methods using same overcome the problems of the prior art by depositing a silicon-containing film on at least a portion of the substrate surface that provides desirable film properties upon post-deposition treatment. The inventive compositions and methods can provide a silicon-containing film having the following characteristics: i) a film tensile stress, as measured using a Toho stress tool, ranging from about 10 to about 20 MPa after a thermal cure and ranging from about 150 to about 190 MPa after a UV cure, and ii) a density, as measured by X-Ray reflectance ranging from about 1.35 to about 2.10 $g/cm^3$.

The silicon-containing film is selected from the group consisting of a silicon nitride, a silicon carbide, a silicon oxide, a carbon-doped silicon nitride, a silicon oxynitride, and a carbon-doped silicon oxynitride film. In certain embodiments, the substrate comprises a surface feature. The term "surface feature", as used herein, means that the substrate or partially fabricated substrate that comprises one or more of the following pores, trenches, shallow trench isolation (STI), vias, reentrant feature, or the like. The compositions can be pre-mixed compositions, pre-mixtures (mixed before being used in the deposition process), or in-situ mixtures (mixed during the deposition process). Thus, in this disclosure the terms "mixture", "formulation", and "composition" are interchangeable.

In one aspect, there is provided a method for depositing a silicon-containing film in a flowable chemical vapor deposition process. A substrate that includes a surface feature is placed into a reactor which is at one or more temperatures ranging from −20° C. to about 100° C. A composition is introduced into the reactor, and the composition includes at least one compound having the formula $R_n SiR^1_{4-n}$ wherein R is selected from a linear or branched $C_2$ to $C_6$ alkenyl group, a linear or branched $C_2$ to $C_6$ alkynyl group; $R^1$ is selected from hydrogen, methyl and a linear or branched $C_2$ to $C_{10}$ alkyl group; and n is a number selected from 0, 1, 2, and 3. A plasma source is provided into the reactor to at least partially react the at least one compound to form a flowable liquid oligomer. The flowable liquid oligomer at least partially fills at least a portion of the surface feature. The plasma source includes both a remote plasma source and an in-situ plasma source operating in combination.

In one particular embodiment, at least one of the remote plasma source and the in-situ plasma source comprises a plasma source is selected from the group consisting of a nitrogen plasma, plasma comprising nitrogen and helium, a plasma comprising nitrogen and argon, an ammonia plasma, a plasma comprising ammonia and helium, a plasma comprising ammonia and argon, helium plasma, argon plasma, hydrogen plasma, a plasma comprising hydrogen and helium, a plasma comprising hydrogen and argon, a plasma comprising ammonia and hydrogen, an organic amine plasma, a plasma comprising oxygen, a plasma comprising oxygen and hydrogen, and mixtures thereof.

In another embodiment, the plasma source for the remote plasma source and/or the in-situ plasma source is selected from the group consisting of a carbon source plasma, including a hydrocarbon plasma, a plasma comprising hydrocarbon and helium, a plasma comprising hydrocarbon and argon, carbon dioxide plasma, carbon monoxide plasma, a plasma comprising hydrocarbon and hydrogen, a plasma comprising hydrocarbon and a nitrogen source, a plasma comprising hydrocarbon and an oxygen source, and mixture thereof.

In any of the above or in an alternative embodiment, the flowable liquid or oligomer is treated at one or more temperatures ranging from about 100° C. to about 1000° C. to densify at least a portion of the materials.

In some embodiments, the post thermal treatment materials are exposed to a plasma, infrared lights, chemical treatment, an electron beam, or UV light to form a dense film.

The above steps define one cycle for the methods described herein; and the cycle can be repeated until the desired thickness of a silicon-containing film is obtained. In this or other embodiments, it is understood that the steps of the methods described herein may be performed in a variety of orders, may be performed sequentially or concurrently (e.g., during at least a portion of another step), and any combination thereof.

The various embodiments of the invention can be used alone or in combinations with each other.

DETAILED DESCRIPTION OF THE INVENTION

Figure 1:
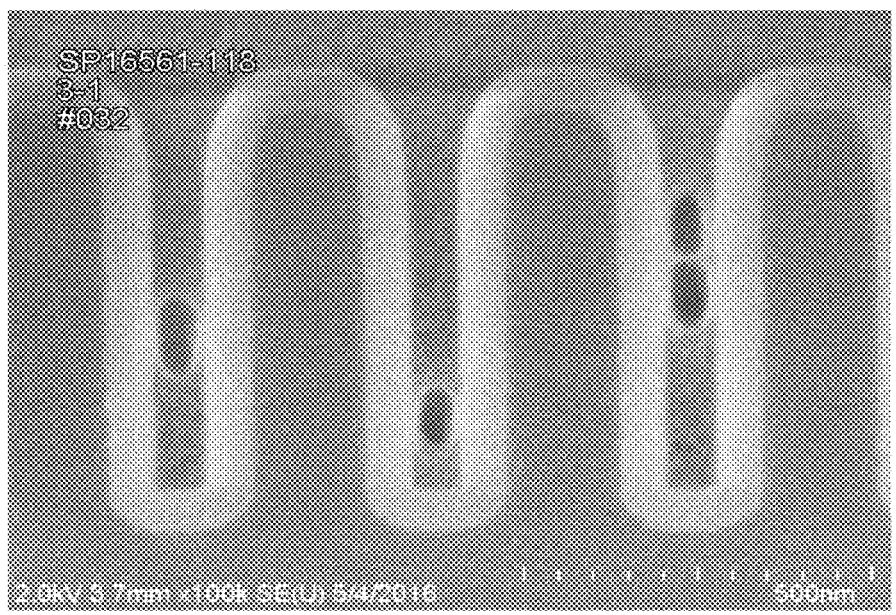
FIG. 1 is an SEM micrograph showing the results of Example 1.

Described herein are FCVD methods for depositing a silicon-containing film in a flowable chemical vapor deposition process, the method comprising: placing a substrate comprising a surface feature into a reactor which is at one or more temperatures ranging from −20° C. to about 100° C.; introducing into the reactor a composition comprising at least one compound having the formula $R_nSiR^1_{4-n}$ wherein R is selected a linear or branched $C_2$ to $C_6$ alkenyl group, a linear or branched $C_2$ to $C_6$ alkynyl group; $R^1$ is selected from hydrogen and a branched $C_1$ to $C_{10}$ alkyl group; and n is a number selected from 0, 1, 2, and 3; and providing a plasma source into the reactor to at least partially react the at least one compound to form a flowable liquid oligomer, wherein the flowable liquid oligomer at least partially fills at least a portion of the surface feature, wherein the plasma source comprises both a remote plasma source and an in-situ plasma source operating in combination.

Films deposited by, for example, flowable chemical deposition treatment typically experience film shrinkage during post-treatment due to the low process temperature. Voids and seams can form in the film due to significant film shrinkage and the increase of film stress. Thus, it has been challenging to densify the film without increasing film stress or creating voids. The composition and method described herein overcomes these problems by improving the fill of at least a portion of a surface feature on a substrate by using the disclosed precursors and compositions comprising the disclosed precursors.

Embodiments of the disclosure provide methods of depositing a gap-fill film (e.g., SiC, SiCO, SiCN, SiCON) in high aspect ratio (AR) structures with small dimensions. Some embodiments advantageously provide methods involving cyclic deposition-treatment processes that can be performed in a cluster tool environment. Some embodiments advantageously provide seam-free high quality silicon-containing films to fill up high AR trenches with small dimensions. Some embodiments advantageously provide films containing high carbon content. In one or more embodiments, the high carbon content films can be advantageously used in hard mask and low-k flowable applications.

One or more embodiments of the disclosure are directed to processes where flowable silicon-containing films are deposited which are able to fill high aspect ratio structures (e.g., AR>8:1). Embodiments of the disclosure provide new precursors to generate SiC, SiOC, SiCN, SiOCN, SiO and SiN flowable films using F-CVD (flowable chemical vapor deposition) for gap-fill applications. The precursors of various embodiments include alkenyl (vinyl) and/or alkynyl groups. In one or more embodiments, the precursors are exposed to reactive radicals to initiate a radical induced polymerization in the deposition chamber.

In one embodiment, the method of the present development comprises the step of placing a substrate comprising a surface feature into a reactor which is at one or more temperatures ranging from −20° C. to about 100° C.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present invention, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As previously mentioned, the method deposits a film upon at least a portion of the surface of a substrate comprising a surface feature. The substrate is placed into the reactor and the substrate is maintained at one or more temperatures ranging from about −20° C. to about 100° C. In one particular embodiment, the temperature of the substrate is less than the walls of the chamber. The substrate temperature is held at a temperature below 100° C., preferably at a temperature below 25° C. and most preferably below 10° C. and greater than −20° C.

As previously mentioned, the substrate comprises one or more surface features. In one particular embodiment, the surface feature(s) have a width of 1 μm in width or less, or 500 nm in width or less, or 50 nm in width or less, or 10 nm in width. In this or other embodiments, the aspect ratio (the depth to width ratio) of the surface features, if present, is 0.1:1 or greater, or 1:1 or greater, or 10:1 or greater, or 20:1 or greater, or 40:1 or greater. The substrate may be a single crystal silicon wafer, a wafer of silicon carbide, a wafer of aluminum oxide (sapphire), a sheet of glass, a metallic foil, an organic polymer film or may be a polymeric, glass, silicon or metallic 3-dimensional article. The substrate may be coated with a variety of materials well known in the art including films of silicon oxide, silicon nitride, amorphous carbon, silicon oxycarbide, silicon oxynitride, silicon carbide, gallium arsenide, gallium nitride and the like. These coatings may completely coat the substrate, may be in multiple layers of various materials and may be partially etched to expose underlying layers of material. The surface may also have on it a photoresist material that has been exposed with a pattern and developed to partially coat the substrate.

In one aspect of the invention, the substrate comprises at least one member selected from the group consisting of Si, $SiO_x$, SiN, SiGe, SiOC and SiON. In another aspect of the invention, the inventive silicon containing film can be employed as a hard mask and provide etch selectivity to a photoresist. In a further aspect of the invention, the inventive silicon containing film functions as a dielectric film between conductive materials, as a barrier between conductive and other dielectric, or as a film within a sandwich dielectric.

The method used to form the films or coatings described herein are flowable chemical deposition processes. Examples of suitable deposition processes for the method disclosed herein include, but are not limited to, cyclic flowable chemical vapor deposition (CFCVD), or plasma enhanced flowable chemical vapor deposition (PEFCVD). As used herein, the term "flowable chemical vapor deposition processes" refers to any process wherein a substrate is exposed to one or more volatile precursors, which react and/or decompose on the substrate surface to provide flowable oligomeric silicon-containing species and then produce the solid film or material upon further treatment and, in some cases at least a portion of the oligomeric species comprises polymeric species. Although the precursors, reagents and sources used herein may be sometimes described as "gaseous", it is understood that the precursors can be either liquid or solid which are transported with or without an inert gas into the reactor via direct vaporization, bubbling or sublimation. In some case, the vaporized precursors can pass through a plasma generator. In one embodiment, the films are deposited using a plasma-based (e.g., remote generated or in situ) CVD process. The term "reactor" as used herein, includes without limitation, a reaction chamber or deposition chamber.

The method of the present development also comprises the step of introducing into the reactor a composition comprising at least one compound having the formula $R_nSiR^1_{4-n}$ wherein R is selected a linear or branched $C_2$ to $C_6$ alkenyl group, a linear or branched $C_2$ to $C_6$ alkynyl group; $R^1$ is selected from hydrogen and a branched $C_1$ to $C_{10}$ alkyl group; and n is a number selected from 1, 2, 3, and 4. Exemplary compounds for Formula I include, but are not limited to, the following:

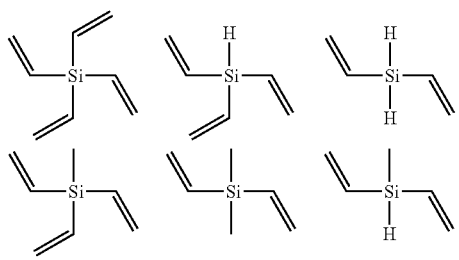

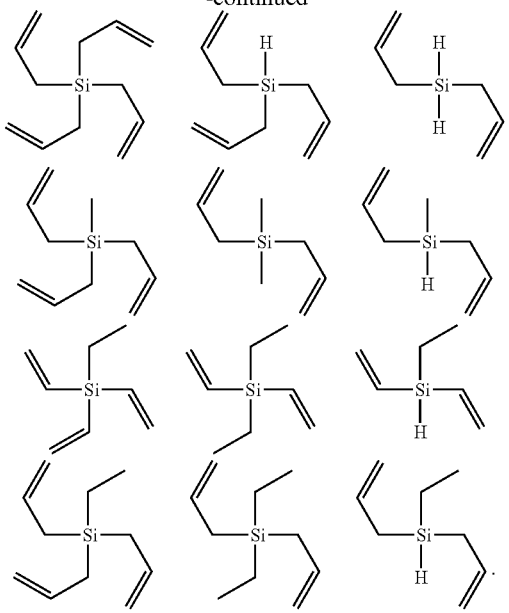

In the formula above and throughout the description, the term "linear or branched alkyl" denotes a linear functional group having from 1 to 10, 3 to 10, or 1 to 6 carbon atoms. In the formulae above and throughout the description, the term "branched alkyl" denotes a linear functional group having from 3 to 10, or 1 to 6 carbon atoms. Exemplary linear or branched alkyl groups include, but are not limited to, methyl (Me), ethyl (Et), isopropyl (Pr'), isobutyl (Bu'), sec-butyl (Bus), tert-butyl (Bu'), iso-pentyl, tert-pentyl (am), isohexyl, and neohexyl. In certain embodiments, the alkyl group may have one or more functional groups such as, but not limited to, an alkoxy group, a dialkylamino group or combinations thereof, attached thereto. In other embodiments, the alkyl group does not have one or more functional groups attached thereto. The alkyl group may be saturated or, alternatively, unsaturated.

In the formulae above and throughout the description, the term "cyclic alkyl" denotes a cyclic group having from 3 to 10 or 5 to 10 atoms. Exemplary cyclic alkyl groups include, but are not limited to, cyclobutyl, cyclopentyl, cyclohexyl, and cyclooctyl groups. In certain embodiments, the cyclic alkyl group may have one or more $C_1$ to $C_{10}$ linear, branched substituents, or substituents containing oxygen or nitrogen atoms. In this or other embodiments, the cyclic alkyl group may have one or more linear or branched alkyls or alkoxy groups as substituents, such as, for example, a methylcyclohexyl group or a methoxycyclohexyl group.

In the formulae above and throughout the description, the term "aryl" denotes an aromatic cyclic functional group having from 3 to 10 carbon atoms, from 5 to 10 carbon atoms, or from 6 to 10 carbon atoms. Exemplary aryl groups include, but are not limited to, phenyl, benzyl, chlorobenzyl, tolyl, and o-xylyl.

In the formulae above and throughout the description, the term "alkenyl group" denotes a group which has one or more carbon-carbon double bonds and has from 2 to 12, from 2 to 10, or from 2 to 6 carbon atoms. Exemplary alkenyl groups include, but are not limited to, vinyl or allyl groups.

The term "alkynyl group" denotes a group which has one or more carbon-carbon triple bonds and has from 2 to 12 or from 2 to 6 carbon atoms.

The term "alkylene group" denotes a group which is derived from an alkyl by removal of two hydrogen atoms. Exemplary alkylene groups include, but are not limited to, methylene (—CH$_2$—) or ethylene (—CH$_2$CH$_2$—) groups.

In the formulae above and through the description, the term "unsaturated" as used herein means that the functional group, substituent, ring or bridge has one or more carbon double or triple bonds. An example of an unsaturated ring can be, without limitation, an aromatic ring such as a phenyl ring. The term "saturated" means that the functional group, substituent, ring or bridge does not have one or more double or triple bonds.

In certain embodiments, one or more of the alkyl group, alkenyl group, alkynyl group, aryl group, and/or cyclic alkyl group in the formulae may be "substituted" or have one or more atoms or group of atoms substituted in place of, for example, a hydrogen atom. Exemplary substituents include, but are not limited to, oxygen, sulfur, halogen atoms (e.g., F, Cl, I, or Br), nitrogen, alkyl groups, and phosphorous. In other embodiments, one or more of the alkyl group, alkenyl group, alkynyl group, aromatic and/or aryl group in the formulae may be unsubstituted.

The silicon precursor compounds are preferably substantially free of halide ions such as chloride or metal ions such as Al. As used herein, the term "substantially free" as it relates to halide ions (or halides) such as, for example, chlorides and fluorides, bromides, iodides, Al$^{3+}$ ions, Fe$^{2+}$, Fe$^{3+}$, Ni$^{2+}$, Cr$^{3+}$ means less than 5 ppm (by weight), preferably less than 3 ppm, and more preferably less than 1 ppm, and most preferably 0 ppm. Chlorides or metal ions are known to act as decomposition catalysts for silicon precursors. Significant levels of chloride in the final product can cause the silicon precursors to degrade. The gradual degradation of the silicon precursors may directly impact the film deposition process making it difficult for the semiconductor manufacturer to meet film specifications. In addition, the shelf-life or stability is negatively impacted by the higher degradation rate of the silicon precursors thereby making it difficult to guarantee a 1-2 year shelf-life. Moreover, silicon precursors are known to form flammable and/or pyrophoric gases upon decomposition such as hydrogen and silane. Therefore, the accelerated decomposition of the silicon precursors presents safety and performance concerns related to the formation of these flammable and/or pyrophoric gaseous byproducts.

The compounds disclosed herein may be delivered to the flowable chemical vapor deposition reactor in a variety of ways including but not limited to vapor draw, bubbling or direct liquid injection (DLI). In one embodiment, a liquid delivery system may be utilized. In another embodiment, reactor may be equipped with a dual plenum showerhead to keep the plasma species generated remotely separate from vapors of the precursors until they are combined in the reactor to deposit flowable liquid. In an alternative embodiment, a combined liquid delivery and flash vaporization process unit may be employed, such as, for example, the turbo vaporizer manufactured by MSP Corporation of Shoreview, Minn., to enable low volatility materials to be volumetrically delivered, which leads to reproducible transport and deposition without thermal decomposition of the precursor. In liquid delivery formulations, the precursors described herein may be delivered in neat liquid form, or alternatively, may be employed in solvent formulations or compositions comprising same. Thus, in certain embodiments the precursor formulations may include solvent component(s) of suitable character as may be desirable and advantageous in a given end use application to form a film on a substrate.

In certain embodiments, the substrate may be exposed to one or more pre-deposition treatments such as, but not limited to, a plasma treatment, thermal treatment, chemical treatment, ultraviolet light exposure, electron beam exposure, and combinations thereof to affect one or more properties of the films. These pre-deposition treatments may occur under an atmosphere selected from inert, oxidizing, and/or reducing.

The method of the present development comprises the step of providing a plasma source into the reactor to at least partially react the at least one compound having the formula R$_n$SiR$^1_{4-n}$ to form a flowable liquid oligomer, wherein the flowable liquid oligomer at least partially fills at least a portion of the surface feature, wherein the plasma source comprises both a remote plasma source and an in-situ plasma source operating in combination.

The process of the present development employs dual plasma sources—a remote plasma source and an in-situ RF plasma source (e.g., capacitive coupled)—to yield the deposition and post-cure films with the best gap fill properties such as being substantially free of visible voids as seen by scanning electron microscopy (SEM). The remote plasma source and an in-situ plasma source operating in combination, which means that both sources are energized at least part of the time during the deposition. In other embodiments, both sources are energized during at least a quarter of the time during the deposition. In other embodiments, both sources are energized during at least half of the time during the deposition. In other embodiments, both sources are energized during at least three quarters of the time during the deposition. In yet other embodiments, both sources are energized the entire time during the deposition.

Plasma power applied to the RPS is 1000-3000 W, preferably 2000-3000 W. Plasma power to the in-situ plasma is 100-1000 W, preferably 200-300 W.

Energy is applied to the at least one compound having the formula R$_n$SiR$^1_{4-n}$ and plasma sources to induce reaction and to form the flowable silicon-containing film or coating on the substrate. Such energy can be provided by, but not limited to, thermal, plasma, pulsed plasma, helicon plasma, high density plasma, inductively coupled plasma, X-ray, e-beam, photon, remote plasma methods, and combinations thereof. In certain embodiments, a secondary RF frequency source can be used to modify the plasma characteristics at the substrate surface. In embodiments wherein the deposition involves plasma, the plasma-generated process may comprise a direct plasma-generated process in which plasma is directly generated in the reactor, or alternatively a remote plasma-generated process in which plasma is generated outside of the reactor and supplied into the reactor.

At least one of the remote plasma source and the in-situ plasma source can comprise nitrogen. The plasma comprising nitrogen can be selected from the group consisting of nitrogen plasma, nitrogen/hydrogen plasma, nitrogen/helium plasma, nitrogen/argon plasma, ammonia plasma, ammonia/helium plasma, ammonia/argon plasma, ammonia/nitrogen plasma, NF$_3$, NF$_3$ plasma, organic amine plasma, and mixtures thereof. The at least one compound and nitrogen source react and form a silicon nitride film (which is non-stoichiometric) or a silicon carbonitride film on at least a portion of the surface feature and substrate. The term "organic amine" as used herein describes an organic compound that has at least one nitrogen atom. Examples of organoamine, but are not limited to, methylamine, ethylamine, propylamine, iso-propylamine, tert-butylamine, sec-butylamine, tert-amylamine, ethylenediamine, dimethylamine, trimethylamine, diethylamine, pyrrole, 2,6-dimethylpiperidine, di-n-propylamine, di-iso-propylamine, ethylmethylamine, N-methylaniline, pyridine, and triethylamine.

At least one of the remote plasma source and the in-situ plasma source can comprise carbon. In such embodiment, the plasma source is selected from but not limited to the group consisting of a carbon source plasma, including a hydrocarbon plasma, a plasma comprising hydrocarbon and helium, a plasma comprising hydrocarbon and argon, carbon dioxide plasma, carbon monoxide plasma, a plasma comprising hydrocarbon and hydrogen, a plasma comprising hydrocarbon and a nitrogen source, a plasma comprising hydrocarbon and an oxygen source, and mixture thereof. The at least one compound and carbon source react and form a silicon carbide film (which is non-stoichiometric), or a silicon carbonitride film, or a silicon oxynitride film, or a silicon oxycarbide film, or a silicon oxycarbonitrde film on at least a portion of the surface feature and substrate.

In a different embodiment, the plasma source is selected from but not limited to hydrogen plasma, helium plasma, argon plasma, xenon plasma, and mixture thereof. The at least one compound and plasma react and form a silicon nitride film, or a silicon carbide film, or a silicon carbonitride film on at least a portion of the surface feature and substrate.

At least one of the remote plasma source and the in-situ plasma source can comprise oxygen. In such embodiments, the oxygen-containing source can be selected from the group consisting of water ($H_2O$), oxygen ($O_2$), oxygen plasma, ozone ($O_3$), NO, $N_2O$, carbon monoxide (CO), carbon dioxide ($CO_2$), $N_2O$ plasma, carbon monoxide (CO) plasma, carbon dioxide ($CO_2$) plasma, and combinations thereof.

Also, after the silicon containing film is deposited, the substrate may be (i.e., optionally) treated with an oxygen-containing source as described above under certain process conditions sufficient to make the silicon nitride film form a silicon oxide or a silicon oxynitride or carbon doped silicon oxide film.

In certain embodiments, the reactor is at a pressure below atmospheric pressure or 750 torr ($10^5$ Pascals (Pa)) or less, or 100 torr (13332 Pa) or less. In other embodiments, the pressure of the reactor is maintained at a range of about 0.1 torr (13 Pa) to about 10 torr (1333 Pa).

Flowable films, as deposited, are generally not stable and age upon exposure to atmospheric conditions. The flowable films of some embodiments are deposited by a silicon-containing precursor and radical forms of, for example, $NH_3/O_2$ as co-reactants. These films are then cured by ozone/UV/steam annealing/$NH_3$ annealing, etc., which results in a cured film.

In certain embodiments, the flowable liquid or oligomer is treated at one or more temperatures ranging from about 100° C. to about 1000° C. to densify at least a portion of the materials. In other embodiments, the flowable liquid or oligomer is treated by exposure to at least one of the following: an oxygen-containing source under certain process conditions sufficient to make the silicon nitride film form a silicon oxide or a silicon oxynitride or carbon doped silicon oxide film. The oxygen-containing source can be selected from the group consisting of water ($H_2O$), oxygen ($O_2$), oxygen plasma, ozone ($O_3$), NO, $N_2O$, carbon monoxide (CO), carbon dioxide ($CO_2$), $N_2O$ plasma, carbon monoxide (CO) plasma, carbon dioxide ($CO_2$) plasma, and combinations thereof.

In some embodiments, the post thermal treatment materials are exposed to a plasma, infrared lights, chemical treatment, an electron beam, or UV light to form a dense film. In one embodiment of the invention, a post treatment comprising exposure to UV light exposure is conducted under conditions to emit gaseous by-products.

The above steps define one cycle for the methods described herein; and the cycle can be repeated until the desired thickness of a silicon-containing film is obtained.

The present development teaches the use of precursor selection that will provide films with a desired silicon to carbon ratio (Si:C). Deposition of films using TVS has provide Si:C ratio of ca. 1:4. The precursor has a Si:C of 1:8. Selection of precursor with multiple Si atoms contained in a ring structure, such as that observed in 1,1,3,3-tetravinyl-1,3-disilacyclobutane can yield films with a higher Si:C. The chemical structure is projected to provide a Si:C of 1:3. Use of precursors such as allyl substituted disilacyclobutanes can potentially provide lower Si:C, possibly approaching 1:1 based on the improved potential of the allyl group as a leaving group during deposition or film curing.

The flowable film 150 can be formed at any suitable temperature. In some embodiments, the flowable film 150 is formed at a temperature in the range of about −20° C. to about 100° C. The temperature can be kept low to preserve the thermal budget of the device being formed. In some embodiments, forming the flowable film occurs at a temperature less than about 300° C., 250° C., 200° C., 150° C., 100° C., 75° C., 50° C., 25° C. or 0° C.

Films with high carbon content may have many applications, for example, in the patterning of hard masks and for flowable low K films. In some embodiments, the flowable film using precursors disclosed herein can deposit films which high carbon content. In some embodiments, the film has a carbon content up to about 85 atomic %. In one or more embodiments, the flowable film has a carbon content greater than about 40, 45, 50, 55, 60, 65, 70, 75 or 80 atomic %, and less than about 95, 90 or 85 atomic %. In some embodiments, the flowable film has a carbon content in the range of about 40 to about 85 atomic %, or in the range of about 50 to about 85 atomic %, or in the range of about 60 to about 80 atomic %.

The composition of the flowable film can be adjusted by changing the composition of the reactive gas. In some embodiments, the flowable film comprises one or more of SiC, SiCO, SiCN, SiCON, SiO and SiN. To form an oxygen containing film, the co-reactant may comprise, for example, one or more of oxygen, ozone or water. To form a nitrogen containing film, the co-reactant may comprise, for example, one or more of ammonia, hydrazine, $NO_2$ or $N_2$. To form a carbon containing film, the reactive gas may comprise, for example, one or more of propylene and acetylene. Those skilled in the art will understand that combinations of or other species can be included in the reactive gas mixture to change the composition of the flowable film.

The flowable film may deposit on the wafer (temperature of the wafer can be from −10° C. to 200° C.) and due to their flowability, polymers will flow through trenches and make a gap-fill. Then these films are subjected curing steps such as ozone/UV/steam annealing/$NH_3$ annealing to get stable films. In some embodiments, the method provides one or more of SiC, SiCO, SiCN, SiCON, SiO, and/or SiN flowable films. Accordingly, after formation of the flowable film 150, the film may be cured to solidify the flowable film and form a substantially seam-free gap-fill. In one or more embodiments, curing the flowable film comprises exposing the flowable film to one or more of ozone, UV light, steam annealing, ammonia annealing and oxygen plasma. In some embodiments, the flowable film is cured by exposing the film to a UV curing process. The UV curing process can occur at a temperature in the range of about 10° C. to about 550° C. The UV curing process can occur for any suitable time frame necessary to sufficiently solidify the flowable film. The UV cure can be performed with different parameters, e.g., power, temperature, environment. In some embodiments, the UV cure occurs in an acetylene/ethylene environment.

In one aspect, there is provided a method for depositing a silicon-containing film in a flowable chemical vapor deposition process, the method comprising: placing a substrate comprising a surface feature into a reactor which is at one or more temperatures ranging from −20° C. to about 100° C.; introducing into the reactor a composition comprising at least one compound having the formula $R_nSiR^1_{4-n}$ wherein R is selected a linear or branched $C_2$ to $C_6$ alkenyl group, a linear or branched $C_2$ to $C_6$ alkynyl group; $R^1$ is selected from hydrogen and a branched $C_1$ to $C_{10}$ alkyl group; and n is a number selected from 0, 1, 2, and 3; and providing a plasma source into the reactor to at least partially react the at least one compound to form a flowable liquid oligomer, wherein the flowable liquid oligomer at least partially fills at least a portion of the surface feature, wherein the plasma source comprises both a remote plasma source and an in-situ plasma source operating in combination.

The following Examples are provided to illustrate certain embodiments of the invention and shall not limit the scope of the appended claims.

EXAMPLES

Flowable chemical vapor deposition (FCVD) films were deposited onto medium resistivity (8-12 Ωcm) single crystal silicon wafer substrates and Si pattern wafers. In certain examples, the resultant silicon-containing films or coatings can be exposed to a pre-deposition treatment such as, but not limited to, a plasma treatment, thermal treatment, chemical treatment, ultraviolet light exposure, Infrared exposure, electron beam exposure, and/or other treatments to affect one or more properties of the film.

Depositions on a modified FCVD chamber on an Applied Materials Precision 5000 system, can be performed using either a silane or a TEOS process kit. The chamber has direct liquid injection (DLI) delivery capability. The precursors are liquids with delivery temperatures dependent on the precursor's boiling point. To deposit initial flowable nitride films, typical liquid precursor flow rates were 100-5000 mg/min, in-situ plasma power density was 0.25-3.5 W/cm², pressure was 0.75-12 Torr. To densify the as-deposit flowable films, the films were thermally annealed and/or UV cured in vacuum using the modified PECVD chamber at 100~1000° C., preferably 300~400° C. Thickness and refractive index (RI) at 632 nm were measured by a SCI reflectometer or Woollam ellipsometer. Typical film thickness ranged from 10 to 2000 nm. Bonding properties and hydrogen content (Si—H, C—H and N—H) of the silicon-based films were measured and analyzed by a Nicolet transmission Fourier transform infrared spectroscopy (FTIR) tool. All density measurements were accomplished using X-ray reflectivity (XRR). X-ray Photoelectron Spectroscopy (XPS) and Secondary ion mass spectrometry (SIMS) analysis were performed to determine the elemental composition of the films. The flowability and gap fill effects on patterned wafers were observed by a cross-sectional Scanning Electron Microscopy (SEM) using a Hitachi S-4700 system at a resolution of 2.0 nm.

Flowable CVD depositions were conducted according to the following conditions.

Example 1

Deposition Conditions—3000 W RPS; 200 W In-Situ; 2 torr; 1500 sccm $NH_3$; 1500 mg/min TVS. Referring to FIG. 1, the films exhibited voids post cure.

Example 2

Figure 2:
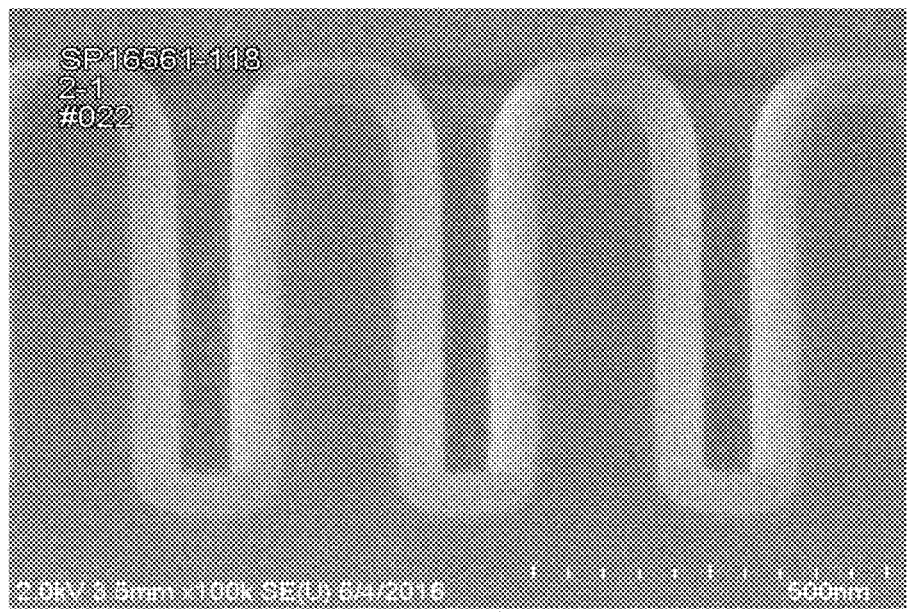
FIG. 2 is an SEM micrograph showing the results of Example 2.

Deposition Conditions—3000 W RPS; 200 W In-Situ; 2 torr; 1000 sccm $NH_3$; 1500 mg/min TVS. Referring to FIG. 2, lower $NH_3$ flow reduced film voiding.

Example 3

Figure 3:
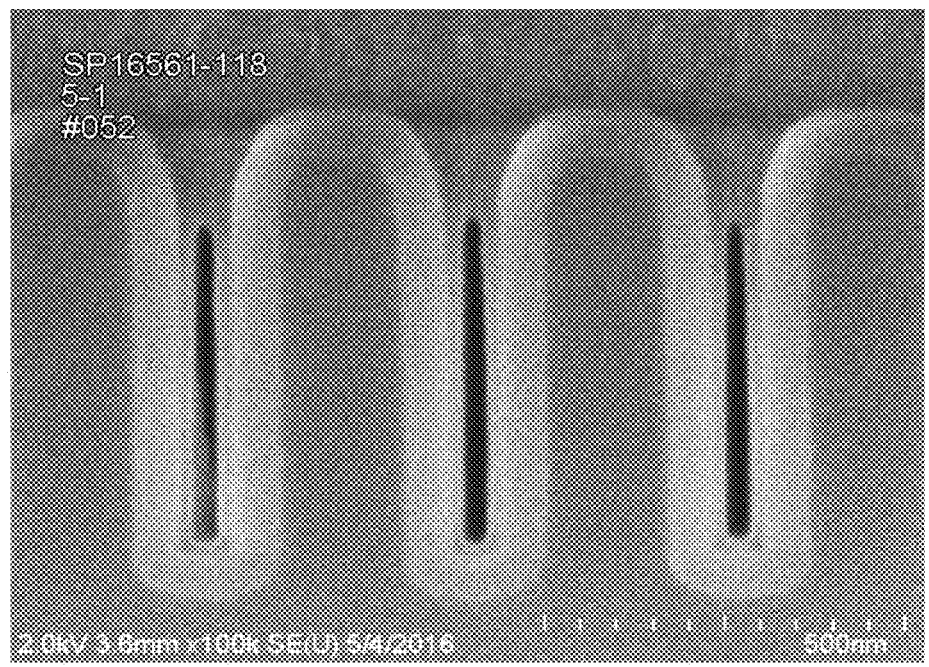
FIG. 3 is an SEM micrograph showing the results of Example 3.

Deposition Conditions—3000 W RPS; 0 W In-Situ; 2 torr; 1000 sccm NH3; 1500 mg/min TVS. Referring to FIG. 3, it can be seen that turning off in-situ plasma caused pinch-off at top of feature.

Example 4

Deposition Conditions—TVS only: 3000 W RPS; 200 W In-Situ; 2 torr; 1000 sccm $NH_3$; 1500 mg/min TVS; TVS+TSA: 3000 W RPS; 200 W In-Situ; 2 torr; 1000 sccm $NH_3$; 1500 mg/min TVS+900 sccm TSA. Referring to Table 1, it can be seen that adding TSA to the chamber and using $NH_3$ in RPS (not in-situ) does not increase N incorporation into the film. It does activate the film for ambient oxidation.

Additional Notes on Example 4: Chemical composition determined by X-ray Photoelectron Spectroscopy (XPS). Some surface oxidation observed in TVS film. Bulk of film had little oxidation. Surface and bulk oxidation much greater in TVS+TSA film.

TABLE 1

| Precursors | Depth (nm) | % C | % N | % O | % Si |
|---|---|---|---|---|---|
| TVS | Surface | 75 | 1 | 9 | 16 |
| TVS | 80 | 80 | 1 | 2 | 17 |
| TVS + TSA | Surface | 63 | 1 | 23 | 13 |
| TVS + TSA | 80 | 69 | 1 | 14 | 16 |

Example 5

Figure 4:
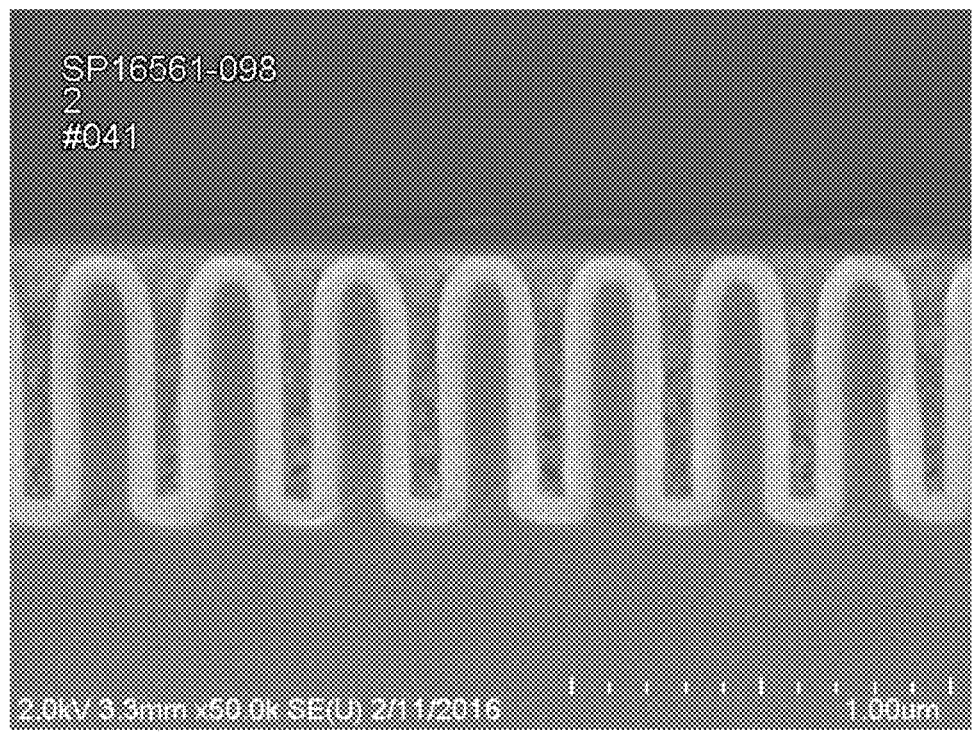
FIG. 4 is an SEM micrograph showing the results of Example 5.

Deposition Conditions—TVS only: 0 W RPS; 200 W In-Situ; 8 torr; 400 sccm $NH_3$; 2000 mg/min TVS; 200 sccm He; 5 sec deposition; referring to FIG. 4 using TVS with only in-situ plasma activation the deposited films exhibited flowability but after curing they exhibited observable porosity in the filled features. Compared to FIG. 2 these films are believed to be of significantly lower density within the feature.

Although certain principles of the invention have been described above in connection with aspects or embodiments, it is to be clearly understood that this description is made only by way of example and not as a limitation of the scope of the invention.

What is claimed is:

1. A method for depositing a silicon-containing film in a flowable chemical vapor deposition process, comprising:

placing a substrate comprising a surface feature into a reactor at a first temperature ranging from −20° C. to about 100° C.;

introducing 1500 mg/min into the reactor a composition consisting of tetravinylsilane providing a plasma source into the reactor to at least partially react the at least one compound to form a flowable liquid oligomer;

wherein the flowable liquid oligomer at least partially fills at least a portion of the surface feature; and wherein the plasma source comprises both a 3000 W remote plasma source and a 200 W in-situ plasma source operating simultaneously during deposition, and wherein the remote plasma is an ammonia plasma, and the in-situ plasma is an ammonia plasma.

2. The method of claim 1, further comprising treating the flowable liquid at a second temperature ranging from about 100° C. to about 1000° C. to cure the oligomer and form a hardened film.

3. The method of claim 2, wherein the film has at least one of the following characteristics: i) a film tensile stress ranging from about 150 to about 190 MPa after a UV cure, and ii) a density ranging from about 1.35 to about 2.10 g/cm$^3$.

4. The method of claim 1, wherein a pressure of the reactor is maintained at 100 torr or less.

5. The method of claim 1, wherein the silicon-containing film is selected from the group consisting of silicon carbide, silicon nitride, silicon oxide, carbon doped silicon nitride, carbon doped silicon oxide, silicon oxynitride, and carbon doped silicon oxynitride film.

6. The method of claim 1, wherein the in-situ plasma source is a capacitively-coupled in-situ plasma.

7. The method of claim 1, wherein the silicon-containing film has a surface and a bulk, wherein the surface has a first nitrogen content measured by X-ray Photoelectron Spectroscopy and the bulk has a second nitrogen content measured by X-ray Photoelectron Spectroscopy, and wherein the first nitrogen content is approximately equivalent to the second nitrogen content.

8. The method of claim 7, wherein the surface has a first carbon content measured by X-ray Photoelectron Spectroscopy and the bulk has a second carbon content measured by X-ray Photoelectron Spectroscopy, and wherein the first carbon content is less than the second carbon content.

9. The method of claim 8, wherein the surface has a first oxygen content measured by X-ray Photoelectron Spectroscopy and the bulk has a second oxygen content measured by X-ray Photoelectron Spectroscopy, and wherein the first oxygen content is greater than the second oxygen content.

10. The method of claim 9, wherein the surface has a first silicon content measured by X-ray Photoelectron Spectroscopy and the bulk has a second silicon content measured by X-ray Photoelectron Spectroscopy, and wherein the first silicon content is approximately equivalent to the second silicon content.

11. The method of claim 10, wherein the first silicon content is less than the second silicon content.

12. A film obtained by the method of claim 1.

* * * * *